United States Patent
Liaw et al.

[11] Patent Number: 5,827,764
[45] Date of Patent: Oct. 27, 1998

[54] METHOD FOR REDUCING THE CONTACT RESISTANCE OF A BUTT CONTACT

[75] Inventors: Jhon-Jhy Liaw, Taipei; Jin-Yuan Lee, Hsin-Chu, both of Taiwan

[73] Assignee: Taiwan Semiconductor Manufacturing Company, Ltd., Hsin-Chu, Taiwan

[21] Appl. No.: 947,833

[22] Filed: Oct. 8, 1997

[51] Int. Cl.⁶ .............................................. H01L 51/8234
[52] U.S. Cl. ...................... 438/238; 438/381; 438/382; 438/597
[58] Field of Search .................... 438/258, 381, 438/382, 210, 329, 597

[56] References Cited

U.S. PATENT DOCUMENTS

| | | | |
|---|---|---|---|
| 4,410,375 | 10/1983 | Sawada et al. | 148/187 |
| 4,877,483 | 10/1989 | Bergemont et al. | 156/653 |
| 4,994,402 | 2/1991 | Chiu | 437/41 |
| 5,358,903 | 10/1994 | Kim | 437/195 |
| 5,686,336 | 11/1997 | Lee | 437/52 |

*Primary Examiner*—Joni Chang
*Attorney, Agent, or Firm*—George O. Saile; Stephen B. Ackerman; William J. Stoffel

[57] ABSTRACT

The present invention provides a method of forming a low contact resistance butt contact 44 between a doped region 30 and a conductive line 16B 18B. The method begins by providing an isolation region 11 on a substrate. A conductive structure 16B 18B comprised of a first polysilicon line 16B and a tungsten silicide layer 18B is formed over the isolation region 11. The substrate has a butt contact area 28 adjacent to the isolation region 11. An inter-poly oxide layer 24 is formed over the resulting surface. A butt contact photoresist layer 26 having an opening 26A exposing the butt contact area 28 and adjacent portions of the isolation region 11 is formed over the oxide layer 24. In an important step, the exposed portions of inter-poly oxide layer 24 and the underlying "high resistivity" tungsten silicide line 18B are etched thereby exposing portions of the first polysilicon layer 16B 16C. In a second key step, ions are implanted into the butt contact area 28 and the exposed portions of the first polysilicon layer 16C. The butt contact 44 is completed by depositing a second polysilicon layer 40 over the inter-poly oxide layer 24, over the exposed portion of the first polysilicon layer 16C and over the substrate in the Butt contact area 28.

16 Claims, 5 Drawing Sheets

METHOD FOR REDUCING THE CONTACT RESISTANCE OF A BUTT CONTACT

BACKGROUND OF THE INVENTION

1) Field of the Invention

This invention relates generally to a structure and the fabrication of a semiconductor memory device and more particularly to the structure and fabrication of a butting contact structure between conductive layers and the substrate in a semiconductor device having a shallow trench isolation (STI).

2) Description of the Prior Art

There is a trend in the semiconductor industry toward fabricating larger and more complex functions on a given semiconductor chip. The larger and more complex functions are achieved by reducing device sizes and spacing and by reducing the junction depth of regions formed in the semiconductor substrate. Among the feature sizes which are reduced in size are the width and spacing of interconnecting metal lines and the contact openings through which the metallization makes electrical contact to device regions. As the feature sizes are reduced, new problems arise which must be solved in order to economically and reliably produce the semiconductor devices. As the contact size and junction depth are reduced, a new device contact process is required to overcome the problems which are encountered. Reducing the contact resistance is a major challenge to the industry.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,521,113 (Hsue et al.) shows a method for forming a butting contact through a gate electrode. U.S. Pat. No. 4,994,402 (Chiu) shows a method for forming self-aligned contacts from the substrate to a contact over the gate. U.S. Pat. No. 5,358,903 (Kim) shows a method of forming a butted contact. U.S. Pat. No. 4,877,483 (Bergemont) shows a method of forming a contact between two conductive lines.

However, there is still a need for a method that forms a butt contact with a lower contact resistance.

SUMMARY OF THE INVENTION

It is an object of the present invention to provide a method for fabricating a butt contact which has a low contact resistance.

It is an object of the present invention to provide a method for fabricating a butt contact between a polysilicon layer and a polycide layer that has a low resistance.

It is another object of the present invention to form a four transistor SRAM having butt contacts to connect the drain of the access transistor (or pull down transistor) to the gate of the driver transistor that has a low contact resistance.

Figure 1:
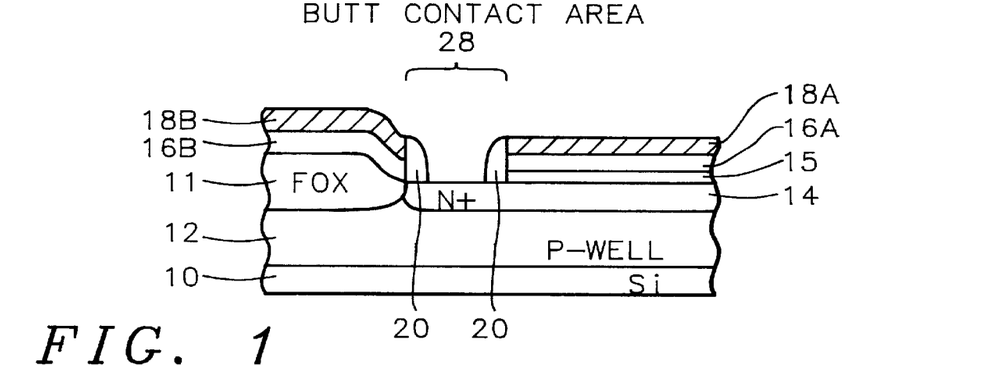
FIGS. 1 through 5 are cross sectional views for illustrating a method for manufacturing a low resistance butt contact according to the present invention.
Figure 2:
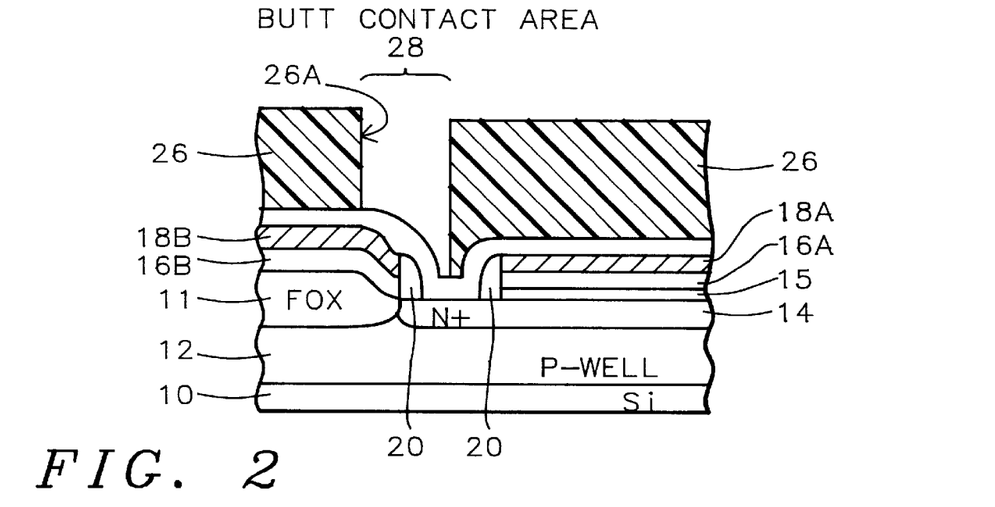
Figure 3:
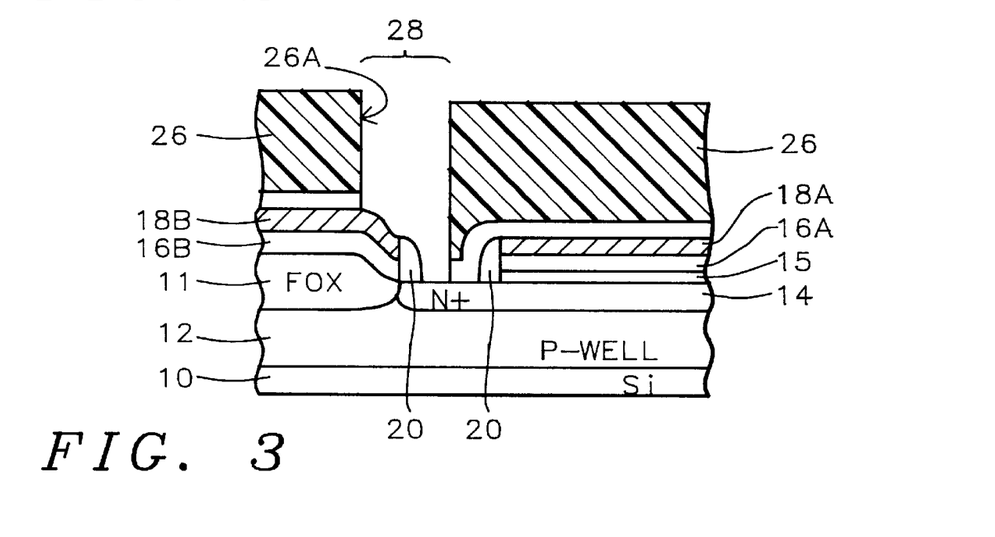
Figure 4:
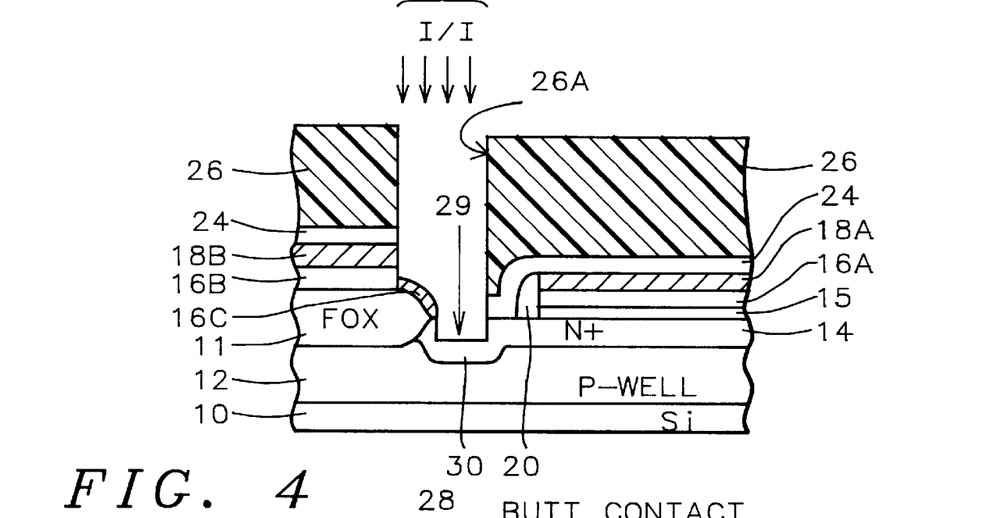
Figure 5:
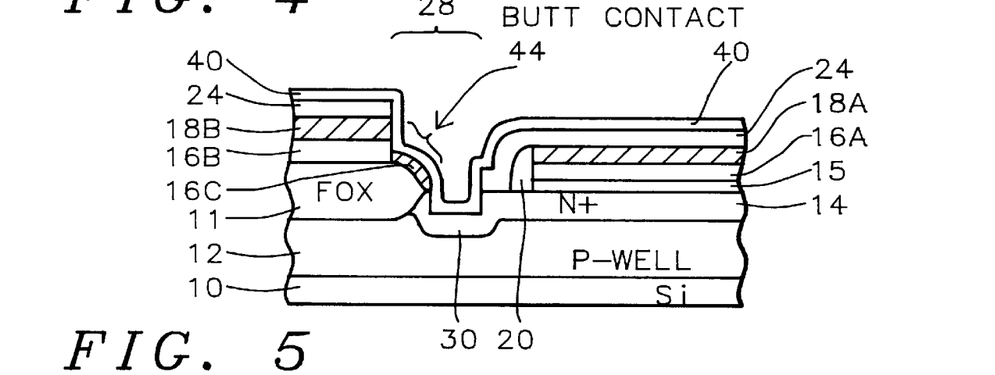

To accomplish the above objectives, the present invention provides a method of manufacturing a butting contact for a semiconductor device comprising the steps of a) See FIG. 1—forming at least an isolation region 11 on a substrate 10, the isolation region defining active regions on the substrate 10;

b) forming a gate oxide layer 15 over the surface of the substrate 10;

c) forming a first polysilicon layer 16 over the gate oxide;

d) deposit a tungsten silicide (WSi2) layer 18 over the first polysilicon layer 16;

e) patterning the first polysilicon layer 16 and the tungsten silicide layer 18 forming a gate electrode 16A 18A over the active region in the substrate and a conductive structure 16B 18B over the isolation region 11; a butt contact area 28 in the substrate is between the isolation region 11 and the gate electrode 16A 18A;

f) forming spacers 20 on the sidewalls of the gate electrode 16A 18A and the conductive structure 16B 18B;

g) forming doped regions 14 in the substrate in at least the butt contact area;

h) See FIG. 2—forming an inter-poly oxide layer 24 over the gate electrode 16A 18A;

i) See FIG. 2—forming a butt contact photoresist layer 26 over the inter-poly oxide layer 24; the butt contact photoresist layer 26 having a butt contact photoresist opening 26A over the butt contact area 28 and over adjacent portions of the isolation region 11;

j) See FIG. 3—etching the inter-poly oxide layer 24 using the butt contact photoresist layer 26 as a mask removing portions of the inter-poly oxide layer 24 over the butt contact area 28 and over portions of the isolation region 11 thereby exposing portions of the tungsten silicide layer 18B over the conductive structure 16B 18B isolation region 11;

k) See FIG. 4—etching the substrate and etching the exposed portions of the tungsten silicide layer 18B of the conductive structure 16B 18B thereby exposing portions 16C of the first polysilicon layer 16B;

l) implanting ions into the butt contact area 28 and the exposed portions of the first polysilicon layer 16B;

m) See FIG. 5—depositing a second polysilicon layer 40 over the inter-poly oxide layer 24, the exposed portion of the first polysilicon layer 16B and over the substrate in the butt contact area 28 thereby forming a butt contact.

The method of the present invention provides a method of forming a butt contact between a polysilicon layer and a polycide layer 16B 18B that has a low contact resistance. After the butt contact opening oxide etch, the invention uses a novel polycide etchback to remove the "high resistance" polycide layer 18B and to expose the underlying polysilicon layer 16c of the conductive structure 16B 18B in the butt contact area 28. Then a novel ion implantation is performed that implants ions into both the exposed polysilicon 16c and the substrate in the butt contact area 28. This polycide etch back and implantation reduce the contact resistance of the butt contact.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 5 are take along axis 1 in FIG. 9.

FIGS. 7A and 7B are cross sectional figures showing the high resistance contact structures of the inventor's previous process that have the high resistance problem that the invention solves.

DETAILED DESCRIPTION OF THE PREFERRED EMBODIMENTS

The present invention will be described in detail with reference to the accompanying drawings. The present invention provides a method of forming a semiconductor device, preferably an SRAM, having a butt contact with a low contact resistance. It should be will understood by one skilled in the art that by including additional process steps not described in this embodiment, other types of devices can also be included on the SRAM chip. For example, P wells 12 in the P substrate and CMOS circuit can be formed therefrom. It should also be understood that the figures depict only one butt contact out of a multitude of contacts that are fabricated simultaneously on the substrate. Also, the butt contact can be used in any chip that has to make a contact from a conductive layer to a doped region in the substrate and other chip types in addition to SRAM chips.

The method of fabrication of a butt contact begins by providing a semiconductor substrate 10. Next, optional doped wells, such as N-wells, and P-wells 12 can be formed on the substrate to concurrently fabricate PMOS and NMOS devices. The wells are preferably driven in a temperature in a range of between about 1000° C. and 1200° C.

As shown in FIG. 1, at least an isolation region 11 is formed on said substrate 10. The isolation regions 11 define active regions on the substrate 10. FIG. 1 is taken through the axis 1 shown in top plan view FIG. 9.

Next, optional NMOS & PMOS threshold voltage implant are performed (not shown in the figures).

A gate oxide layer 15 is formed over the surface of the substrate 10. The gate oxide layer preferably has a thickness in a range of between about 55 and 140 Å.

Next, a first polysilicon layer (shown as layers 16A and 16*b*) is formed over the gate oxide layer 15. The first polysilicon layer is preferably formed of two layers: a spilt polysilicon layer and a gate polysilicon layer (both layer are shown as 16A and 16B in the figures. The total thickness of the first polysilicon layer is in a range of between about 1000 and 2100Å. The split polysilicon layer preferably is composed of a in-situ doped polysilicon with a thickness in a range of between about 500 and 600 Åand more preferably about 550Å. The split poly layer is used to protect the gate oxide layer during a subsequent buried contact process.

Next, preferably before the gate polysilicon layer is formed, the buried contact areas (photo & etch) are defined.

A gate polysilicon layer is formed over the gate oxide layer 15 and isolation 11 as shown in FIG. 1. The first polysilicon layer preferably is composed of a in-situ doped polysilicon with a thickness in a range of between about 500 and 1500Å and more preferably about 1000Å.

Next, a silicide (e.g., WSi2) layer 18 is next formed over the first polysilicon layer 16. The silicide layer is preferably formed of tungsten silicide. The tungsten silicide layer 18 preferably has a preferably between 1000 and 1500Å. The silicide layer reduces the lower gate resistance and interconnect resistance.

Next, the first polysilicon layer 16A 16B and the tungsten silicide layer 18A 18B are patterned forming a gate electrode 16A 18A over the active areas in the substrate and a conductive structure 16B 18B (e.g., silicide line 18B and polysilicon line 16B) over the isolation region 11, the gate poly layer 16A and the silicide layer 18A. The active areas are the non-isolation areas of the substrate.

In the substrate, a butt contact area 28 is defined between the isolation region 11 and the gate electrode 16A 18A as shown in FIG. 1. The conductive line 16B and 18B is preferably a load resistor in a SRAM cell.

FIG. 1 shows the formation of spacers 20 on the sidewalls of the gate electrode 16A 18A and the sidewalls of the conductive structure 16B 18B. The spacers are preferably comprised of oxide and preferably have a thickness in a range of between about 600 and 2500Å.

Subsequently, doped regions 14 (e.g., source and drain regions) are formed in the substrate. The implant is preferably performed with As ions at a dose in a range of between about 1E15 and 6E15 /cm$^2$ and at an energy in a range of between about 20 and 80 Kev.

Referring to FIG. 2, an inter-poly oxide layer 24 is formed over the gate electrode 16A 18A. The inter-poly oxide layer 24 is preferably comprised of an oxide formed using a LPTEOS or PETEOS process. The inter-poly oxide layer 24 preferably has a thickness in a range of between about 1000 and 2000 Å.

FIG. 2 shows the formation of a butt contact photoresist layer 26 (e.g., poly 2-via photo ) over the inter-poly oxide layer 24. The butt contact photoresist layer 26 has a butt contact photoresist opening 26A over the butt contact area 28 in the substrate and over adjacent portions of the isolation region 11.

Figure 6A:
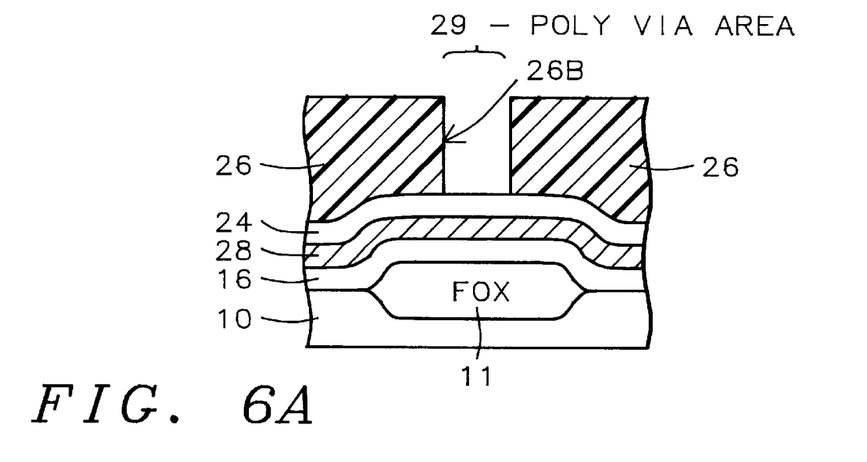
FIGS. 6A, 6B, and 6C are cross sectional views showing the concurrent formation of a poly via contact using the same process steps used in forming the butt contact shown in FIGS. 1 through 5 according to the present invention.

Also, as shown in FIG. 6A, in another part of the substrate, a poly via contact is formed in a poly via area 29. FIG. 6A shows the butt contact photoresist layer 26 having poly via opening 26B over poly -via areas 29.

FIG. 3 shows the etching of the inter-poly oxide layer 24 using the butt contact photoresist layer 26 as a mask. The etch removes portions of the inter-poly oxide layer 24 over the butt contact area 28 and over portions of the conductive structure 16B 18B and over the isolation region 11 thereby exposing portions of the tungsten silicide layer 18B over the isolation region 11. The etch preferably removes between about 3000 and 7000 Å of the oxide layer 24 and more preferably about 5000 Å.

Figure 6B:
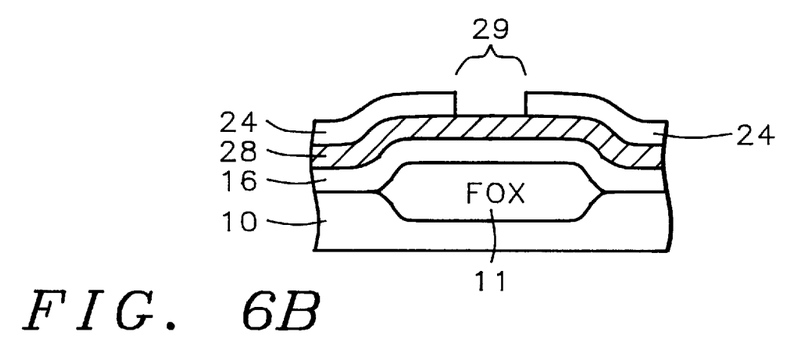

Also as show in FIG. 6B, the inter poly oxide layer 24 over the tungsten silicide layer 18 is etched through the resist layer 26 thus exposing the first polysilicon layer 16 over the poly via area 29.

FIG. 4 shows two important steps of the invention: (1) the polycide layer 18B etch and (2) the P implant into the butt contact area 28. In the first step, the etch etches the exposed portions of the tungsten silicide layer 18B thereby exposing portions of the first polysilicon layer 16B on the conductive structure. Optionally, the polycide etch also can etch the substrate forming a first hole 29 (or depression) in the substrate surface. The etch can use a $Cl_2$ containing etchant to etch the polycide and silicon.

Figure 7A:
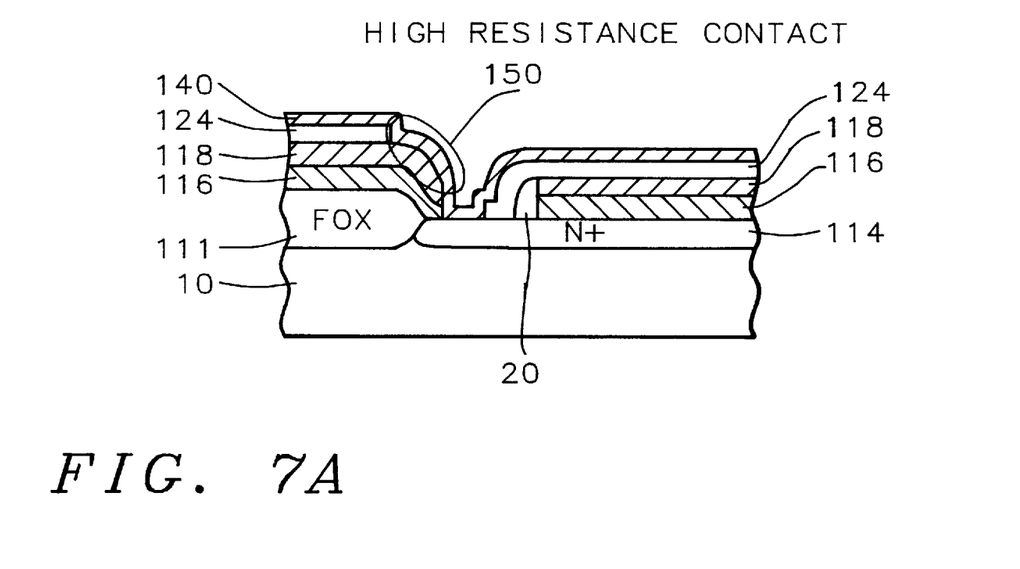
FIG. 7A is a cross section of a buried contact and FIG. 7B is a cross sectional figure of a poly via contact.

This etch is critical to reducing the butt contact resistance. The etch removes the "high resistance" tungsten silicide layer 18B over the isolation region 11. As shown in FIG. 7, the inventor made the important discovery in one of the inventor's butt processes. A high resistance contact 150 was being formed between the tungsten silicide layer 118 and an overlying second polysilicon layer 140. The high resistance in the polycide layer 118 is thought to be caused by native oxide growth which induces high contact resistance (PolySi/$WSi_x$).

To alleviate this high resistance contact 150, the invention removes the tungsten silicide layer 18B and exposes the underlying polysilicon layer 16B. Then a low resistance butt contact is formed in subsequent step where a second polysilicon layer 40 is formed contacting the exposed first polysilicon layer 16B instead of the tungsten silicide layer 18B.

FIG. 4 shows the implantation of ions into the butt contact area 28 and the exposed portions of the first polysilicon layer 16B thereby forming the doped poly line area 16C and doped contact region 30. The implantation of the ions into area 28 is preferably performed by implanting P31 ions at an energy in a range of between about 20 and 80 Kev and a dose in a range of between about 2E14 and 2E15/cm2. This implantation is critical for reducing the butt contact resistance.

Figure 6C:
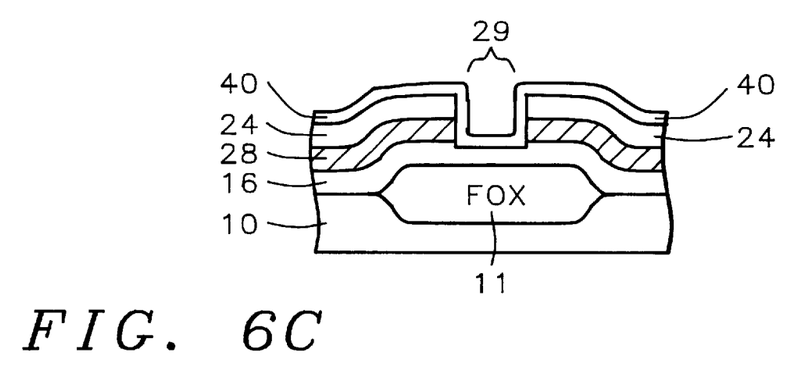

This implantation can also be performed in the poly via area 29 as shown in FIG. 6c. The implantation is optional in this area. Any excessive ions are harmlessly implanted into the isolation regions 11.

FIG. 5 shows the deposition of a second conductive (e.g., polysilicon) layer 40 over the inter-poly oxide layer 24, the exposed portion of the first polysilicon layer 16B 16C and over the substrate in the butt contact area 28. The second conductive line can be formed of undoped polysilicon and is more preferably formed of polysilicon. This completes the formation the invention's low resistance butt contact. Where the butt contact is fabricated for a load resistor of a 4 T-SRAM, the second polysilicon layer is preferably comprised of a undoped polysilicon preferably having a thickness in a range of between about 300 and 1000 Å and more preferably about 550 Å.

FIG. 6C shows the second polysilicon layer deposited over the poly via area 18 thus forming a lower resistance poly via. This illustrates that the process of the invention can be implemented at several locations/structures of the substrate and is compatible with several processes.

A SRAM device can be completed performing the following steps.
   a) define poly-2 area (include poly-2 photo & etch)
   b) define poly-2 local interconnect implant (VCC & butt contacts)
   c) BPTEOS deposition (undoped PFTEOS (1–2 kA)+ BPTEOS( 3–12 kA))
   d) BPTEOS flow ( 750–900 C)
   e) Contact Metal-I, via Metal-2 and passivation areas (include sputter, photo and-etch).

Figure 8:
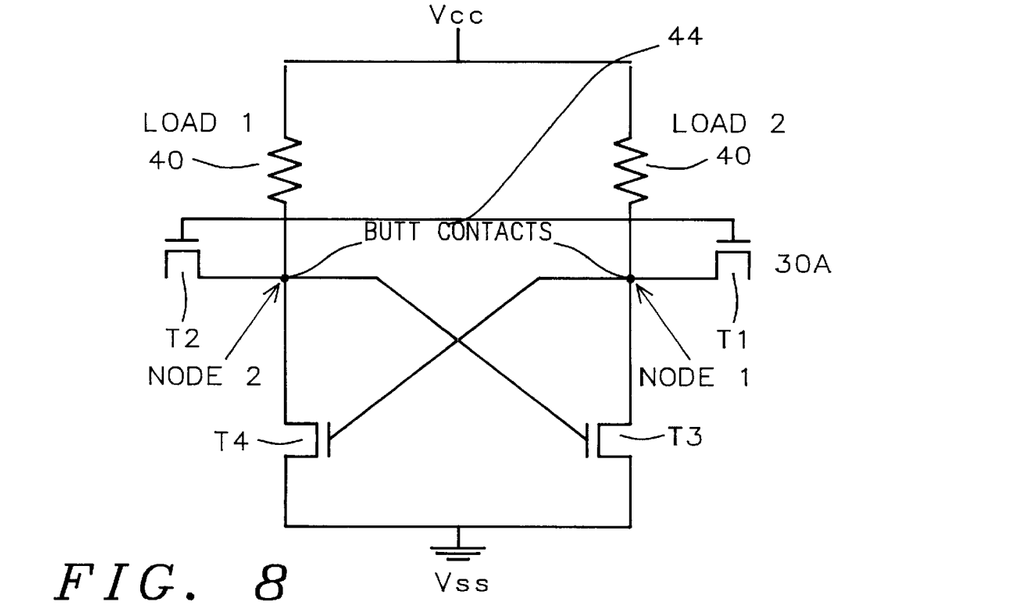
FIG. 8 is a schematic view of a 4T SRAM with load resistors 60 that can be used to implement the butt contact 44 of the present invention.

FIG. 8 shows a schematic diagram of a 4T 2 Load SRAM (two poly layers) that the inventor has implemented butt contacts 44 between the nodes 1 and 2 and the gates of transistors T3 and T4. The transistors T1 T2 T3 and T4 are preferably NMOS transistors. The gates of the transistors are formed from the poly 1 layer 16A. The load 1 and 2 resistors are formed from the poly 2 layer 40.

Figure 9:
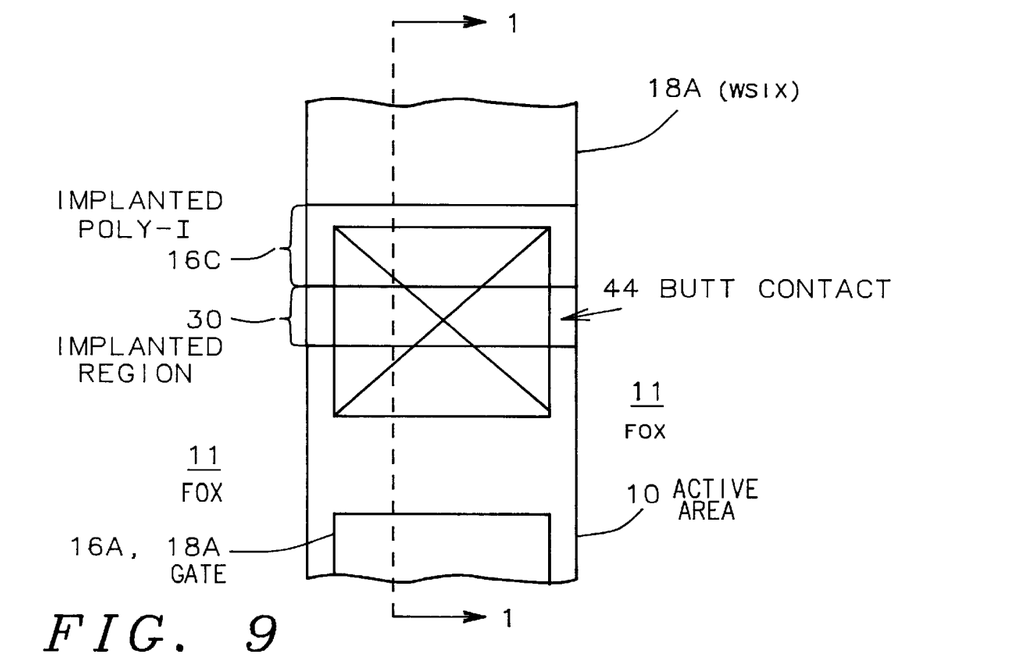
FIG. 9 is a top plan view showing the butt contact 44 of the present invention.

FIG. 9 shows a top plan view of the butt contact of the invention.

The method of the present invention provides a method of forming a butt contact between a second polysilicon layer 40 and a polysilicon/polycide layer 16B 18b that has a low contact resistance. The invention has two important steps that reduce the butt contact resistance: (1) a polycide etch to expose the polysilicon layer 16B in the butt contact hole and (2) an ion implant in the butt contact area.

In the first important step, after the butt contact opening oxide etch, the invention uses a novel polycide etchback to expose polysilicon in the butt contact area. This etch is critical to reducing the butt contact resistance. The etch removes the tungsten silicide layer 18B over the isolation region 11. As shown in FIG. 7A, the inventor made the important discovery in one of the inventor's butt processes. The high resistance contact was being formed between the tungsten silicide layer 124 and an overlying second polysilicon layer 140. The invention removes the tungsten silicide layer 18B and exposes the underlying polysilicon layer 16B. Then a low, resistance butt is formed in subsequent step where a second polysilicon layer 40 is formed contacting the exposed first polysilicon layer 16B instead of the tungsten silicide layer 18B.

In the second important step, an ion implantation is performed that implants both the polysilicon 16b and the substrate in the butt contact area. The polycide etch back and implantation reduce the contact resistance of the butt contact.

Figure 7B:
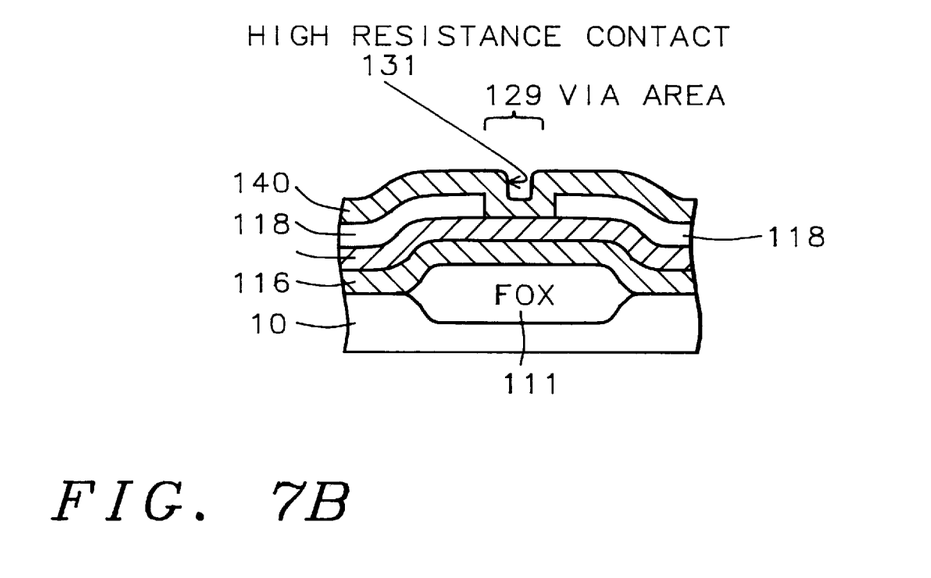

In addition, the process of the invention can be applied to other contacts on the wafer such as via contacts. As shown in FIG. 7B the inventor's previous via contact 131 suffered from similar high resistivity problems. A high resistivity contact 131 was formed in the polysilicon via area 129 between the polycide layer 118 and the 2nd polysilicon layer 140. FIG. 6C shows the process of the invention implemented on a via contact.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a butt contact comprising the steps of:
   a) forming at least an isolation region on a substrate, said isolation region defining active regions on said substrate;
   b) forming a gate oxide layer over said substrate;
   c) forming a first polysilicon layer over said gate oxide layer;
   d) deposit a silicide layer over said first polysilicon layer;
   e) patterning said first polysilicon layer and said silicide layer forming a gate electrode over said substrate and a conductive structure over said isolation region; said substrate has a butt contact area in between said isolation region and said gate electrode;
   f) forming spacers on the sidewalls of said gate electrode and said conductive structure;
   g) forming an inter-poly oxide layer over said gate electrode;
   h) forming a butt contact photoresist layer over said inter-poly oxide layer; said butt contact photoresist layer having a butt contact photoresist opening over said butt contact area and over adjacent portions of said isolation region;
   i) etching said inter-poly oxide layer using said butt contact photoresist layer as a mask removing portions of said inter-poly oxide layer over said butt contact area and over said portions of said isolation region thereby exposing portions of said tungsten silicide layer over said isolation region;

j) etching the exposed portions of said silicide layer thereby exposing a portion of said first polysilicon layer; and k) implanting ions into said butt contact area and the exposed portion of said first polysilicon layer;

l) depositing a second polysilicon layer over said inter-poly oxide layer, said exposed portion of said first polysilicon layer and over said substrate in said butt contact area thereby forming a low resistance butt contact.

2. The method of claim 1 wherein said first polysilicon layer has a thickness in a range of between about 500 Å and 1500 Å.

3. The method of claim 1 wherein said silicide layer composed of tungsten silicide having a thickness in a range of between about 1000 and 1500 Å.

4. The method of claim 1 wherein said inter-poly oxide layer is comprised of an oxide formed using a process selected from the group consisting of low pressure tetraethyl orthosilicate (LPTEOS) and plasma enhanced tetraethyl orthosilicate (PETEOS) and having a thickness in a range of between about 1000 and 2000 Å.

5. The method of claim 1 wherein the implantation of said ions into said butt contact area is performed by implanting P31 ions at an energy in a range of between about 20 and 80 Kev and a dose in a range of between about 2E14 and 2E15/cm2.

6. The method of claim 1 wherein said second polysilicon layer composed of undoped polysilicon has a thickness in a range of between about 500 and 600 Å.

7. The method of claim 1 which further includes after step f) forming source and drain regions in said substrate; said drain region is in said butt contact area.

8. The method of claim 1 which further includes in step j) etching said substrate forming a depression in said butt contact area.

9. The method of claim 1 which further includes simultaneously forming a via poly contact in a poly via area.

10. A method of fabrication of a butt contact comprising the steps of:

a) forming at least an isolation region on said substrate, said isolation region defining active regions on said substrate;

b) forming a gate oxide layer over said substrate;

c) forming a first polysilicon layer over said gate oxide layer; said first polysilicon layer having a total thickness in a range of between about 1000 Å and 2100 Å;

d) deposit a silicide layer over said first polysilicon layer; said silicide layer composed of tungsten silicide having a thickness in a range of between about 1000 and 1500 Å;

e) patterning said first polysilicon layer and said silicide layer forming a gate electrode over said substrate and a conductive structure over said isolation region; said substrate having a Butt contact area between said isolation region and said gate electrode;

f) forming spacers on sidewalls of said gate electrode and said conductive structure;

g) forming an inter-poly oxide layer over said gate electrode;

h) forming a butt contact photoresist layer over said inter-poly oxide layer; said butt contact photoresist layer having a butt contact photoresist opening over said butt contact area and over adjacent portions of said isolation region;

i) etching said inter-poly oxide layer using said butt contact photoresist layer as a mask removing portions of said inter-poly oxide layer over said butt contact area and over said portions of isolation region thereby exposing portions of said tungsten silicide layer over said isolation region;

j) etching the exposed portions of said silicide layer thereby exposing portions of said first polysilicon layer and etching said substrate; and k) implanting ions into said butt contact area and the exposed portions of said first polysilicon layer;

l) depositing a second polysilicon layer over said inter-poly oxide layer, the exposed portion of said first polysilicon layer and over said substrate in said butt contact area thereby forming a Butt contact.

11. The method of claim 10 wherein said inter-poly oxide layer comprised of an oxide formed using a process selected from the group consisting of LPTEOS and PETEOS and having a thickness in a range of between about 1000 and 2000 Å.

12. The method of claim 10 wherein the implantation of said ions into said butt contact area is performed by implanting P31 ions at an energy in a range of between about 20 and 80 Kev and a dose in a range of between about 2E14 and 2E15/cm2.

13. The method of claim 10 wherein said second polysilicon layer composed of undoped polysilicon having a thickness in a range of between about 500 and 600 Å.

14. The method of claim 10 which further includes simultaneously forming a via poly contact in a poly via area.

15. A method of fabrication of a butt contact comprising the steps of:

a) forming at least an isolation region on said substrate, said isolation region defining active regions on said substrate;

b) forming a gate oxide layer over said substrate;

c) forming a first polysilicon layer over said gate oxide layer; said first polysilicon layer having a thickness in a range of between about 500 Å and 1500 Å;

d) deposit a silicide layer over said first polysilicon layer; said silicide layer composed of tungsten silicide having a thickness in a range of between about 1000 Å and 1500 Å e) patterning said first polysilicon layer and said silicide layer forming a gate electrode over said substrate and a conductive structure over said isolation region; said substrate having a Butt contact area between said isolation region and said gate electrode;

f) forming spacers on sidewalls of said gate electrode and said conductive structure;

g) forming an inter-poly oxide layer over said gate electrode; said inter-poly oxide layer comprised of an oxide formed using a process selected front the group consisting of LPTEOS and PETEOS and having a thickness in a range of between about 1000 and 2000 Å;

h) forming a butt contact photoresist layer over said inter-poly oxide layer; said butt contact photoresist layer having a butt contact photoresist opening over said butt contact area and over adjacent portions of said isolation region;

i) etching said inter-poly oxide layer using said butt contact photoresist layer as a mask removing portions of said inter-poly oxide layer over said butt contact area and over said portions of said isolation region thereby exposing portions of said tungsten silicide layer over said isolation region;

j) etching the exposed portions of said silicide layer thereby exposing portions of said first polysilicon layer and etching said substrate forming a depression in said substrate;

k) implanting ions into said butt contact area and the exposed portions of said first polysilicon layer; the implantation of said ions into said butt contact area is performed by implanting P31 ions at an energy in a range of between about 20 and 80 Kev and a dose in a range of between about 2E14 and 2E15/cm2;

l) depositing a second polysilicon layer over said inter-poly oxide layer, the exposed portion of said first polysilicon layer and over said substrate in said butt contact area thereby forming a low resistance butt contact; said second polysilicon layer composed of undoped polysilicon having a thickness in a range of between about 500 and 600 Å.

16. The method of claim 15 which further includes simultaneously forming a via poly contact in a poly via area.

* * * * *